United States Patent
Ballandras et al.

(10) Patent No.: US 8,922,095 B2
(45) Date of Patent: Dec. 30, 2014

(54) TRANSPONDER HAVING COUPLED RESONANT MODES AND INCLUDING A VARIABLE LOAD

(75) Inventors: Sylvain Ballandras, Besancon (FR); William Daniau, Montfaucon (FR); Jean-François Leguen, Mouans Sartoux (FR)

(73) Assignees: Senseor, Mougins (FR); Centre National de la Recherche Scientifique -CNRS, Paris (FR); Universite de Franche Comte, Besancon (FR)

( * ) Notice: Subject to any disclaimer, the term of this patent is extended or adjusted under 35 U.S.C. 154(b) by 96 days.

(21) Appl. No.: 13/500,620

(22) PCT Filed: Oct. 8, 2010

(86) PCT No.: PCT/EP2010/065143
§ 371 (c)(1),
(2), (4) Date: May 3, 2012

(87) PCT Pub. No.: WO2011/042557
PCT Pub. Date: Apr. 14, 2011

(65) Prior Publication Data
US 2012/0206996 A1 Aug. 16, 2012

(30) Foreign Application Priority Data
Oct. 9, 2009 (FR) ..................... 09 04844

(51) Int. Cl.
*H03H 9/02* (2006.01)
*H03H 9/54* (2006.01)

(52) U.S. Cl.
CPC ........... *H03H 9/542* (2013.01); *G06K 19/0672* (2013.01); *G06K 19/0675* (2013.01); *H03H 9/02637* (2013.01); *H03H 9/205* (2013.01); *H03H 9/25* (2013.01); *H03H 9/584* (2013.01); *H03H 9/585* (2013.01); *H03H 9/6406* (2013.01); *H03H 2009/02204* (2013.01)
USPC ....................................... 310/313 R; 310/321

(58) Field of Classification Search
CPC ..... H03H 9/02637; H03H 9/205; H03H 9/25; H03H 9/542; H03H 9/584; H03H 9/585
USPC ...... 310/313 R, 313 A, 313 B, 313 C, 313 D, 310/320, 321
See application file for complete search history.

(56) References Cited

U.S. PATENT DOCUMENTS 3,839,687 A * 10/1974 Subramanian ................ 333/194
5,296,824 A * 3/1994 Cho et al. ...................... 333/193
(Continued)

FOREIGN PATENT DOCUMENTS

DE  19634621 A1  3/1998
EP  0487783 A1  6/1992
(Continued)

OTHER PUBLICATIONS

William Steichen et al.: "Composants acoustique utilisés pour le filtrage: revue des différentes technologies" [Acoustic components used for filtering: review of the various technologies], Techniques de L'Ingénieur, E2000, TI Editions, 2008.

(Continued)

*Primary Examiner* — Derek Rosenau
(74) *Attorney, Agent, or Firm* — Baker & Hostetler LLP (57) ABSTRACT

A transponder including a first resonator and a series of one or more second resonators with coupling of evanescent waves exhibiting at least one first resonant mode and one second resonant mode, said first resonator being connected via a first port, to a first means allowing an interrogation, wherein said second resonators are connected via at least one second port, to at least one variable load element capable of modifying coupling conditions of the resonant modes and consequently a response measured on said first port.

20 Claims, 9 Drawing Sheets

(51) Int. Cl.

| | |
|---|---|
| *G06K 19/067* | (2006.01) |
| *H03H 9/205* | (2006.01) |
| *H03H 9/25* | (2006.01) |
| *H03H 9/58* | (2006.01) |
| *H03H 9/64* | (2006.01) |

(56) References Cited

U.S. PATENT DOCUMENTS

| | | |
|---|---|---|
| 6,316,861 B1 | 11/2001 | Ballandras et al. |
| 2002/0135270 A1 | 9/2002 | Ballandras et al. |
| 2003/0127944 A1 | 7/2003 | Clark et al. |
| 2004/0159154 A1 | 8/2004 | Dollinger et al. |
| 2005/0162048 A1 | 7/2005 | Solal et al. |
| 2006/0091978 A1 | 5/2006 | Wang et al. |
| 2007/0139165 A1 | 6/2007 | Liu |
| 2008/0122558 A1* | 5/2008 | Yoneya et al. ............ 333/196 |
| 2008/0303650 A1 | 12/2008 | Fagot-Revurat et al. |
| 2010/0289380 A1 | 11/2010 | Ballandras et al. |
| 2010/0313398 A1 | 12/2010 | Chommeloux et al. |
| 2010/0319184 A1 | 12/2010 | Leguen et al. |
| 2011/0012477 A1 | 1/2011 | Chommeloux et al. |
| 2011/0241482 A1 | 10/2011 | Droit et al. |

FOREIGN PATENT DOCUMENTS

| | | |
|---|---|---|
| EP | 2051377 A1 | 4/2009 |
| WO | 96/33423 A1 | 10/1996 |

OTHER PUBLICATIONS

L. Reindl: "Wireless Passive SAW Identification Marks and Sensors," 2nd Int. Symp. Acoustic Wave Devices for Future Mobile Communication Systems, Chiba Univ. Mar. 3-5, 2004.

S. Ballandras et al.: "Simulations of surface acoustic wave devices built on stratified media using a mixed finite element/boundary integral formulation", J. Appl. Phys., 96, 7731-7741 (2004)].

S. Ballandras et al.: "A mixed finite element/boundary element approach to simulate complex guided elastic wave periodic transducers", J. Appl. Phys. 105, 014911 (2009); doi:10.1063/1.3021307].

Waldemar Soluch: "Surface Acoustic Wave Two Resonator Filter Using Synchronous Coupling Interdigital Transducers," IEEE Transactions on Ultrasonics, Ferroelectrics and Frequency Control, IEEE, US, vol. 44, No. 1, Jan. 1, 1997, pp. 218-219.

* cited by examiner

TRANSPONDER HAVING COUPLED RESONANT MODES AND INCLUDING A VARIABLE LOAD

CROSS-REFERENCE TO RELATED APPLICATIONS

This application is a National Stage of International patent application PCT/EP2010/065143, filed on Oct. 8, 2010, which claims priority to foreign French patent application No. FR 09 04844, filed on Oct. 9, 2009, the disclosures of each of which are incorporated by reference in their entireties.

FIELD OF THE DISCLOSED SUBJECT MATTER

The field of the invention is that of remotely interrogatable, acoustic wave resonator-based transponders.

BACKGROUND

In the field of remotely interrogatable passive transponders, recourse may currently be had to delay lines produced on lithium niobate and operating in their wireless version in the ISM band centered at 2.45 GHz (imposed by the band requirement necessary for the associated spectral function) on the basis of electrodes generating acoustic waves.

This type of transponder can notably be used for detecting variations in physical parameters such as pressure, temperature, etc.

This poses the difficulty of producing delicate technological devices through the dimensions of the electrode combs of the transducers (0.4 µm typically, i.e. a wavelength of 1.6 µm for propagation speeds of 3500 to 3800 m.s$^{-1}$). These devices must be produced on lithium niobate to obtain electromechanical couplings that are compatible with the corresponding mode of interrogation ($Ks^2$ at least equal to 5%). These structures therefore exhibit large drifts in temperature which may pose a problem in certain cases.

Moreover, to produce the suitable delays (that is to say compatible with the permitted bandwidth), these delay lines exhibit dimensions of the order of 6 to 10 mm, excluding encapsulation, possibly turning out to be critical for applications demanding sensors of small dimension.

Thus for an application of this principle at lower frequencies, the analysis possibly being considered purely linear as a first approximation, the corresponding dimensions are dependent on the frequency scale ratio. And for a 434-MHz reflective delay line application, the distance required to generate the sought-after delays is of the order of 6 times that at 2.45 GHz.

Moreover, the band permitted for emission at 434 MHz is relatively eight times as narrow, thus imposing still larger propagation distances.

2.45-GHz devices used as transponders and comprising a wideband transducer emitting Rayleigh surface waves have also already been proposed. The latter are reflected on reflecting arrays and are detected by the emitter transducer, thus returning a signal of barcode type (the presence of a reflecting group corresponding to logic 1, its absence to 0). This response may be modulated in intensity by connecting a load of variable electrical properties.

Another approach can also consist in using two independent resonators, one of which sees its properties modulated by a load connected in parallel or in series. The latter approach is, however, tricky to implement effectively insofar as whatever the electrical association adopted, the load inevitably influences both the resonators forming the sensor/transponder (it is probably not possible to envisage a measurement with a lone resonator disturbed by the load, the measurement always requiring a reference intended to eliminate the correlated disturbance sources).

SUMMARY

Accordingly, the invention proposes a solution making it possible notably to reliably identify the fact that a transponder is in ON mode or in OFF mode, by tracking the analysis of resonance peaks rather than by simple absence or presence of resonance peaks, as proposed in the known art.

More precisely, the subject of the present invention is a transponder comprising at least one first resonator and one second resonator or a series of second resonators with coupling of evanescent waves exhibiting at least one first resonant mode and one second resonant mode, said first resonator and second resonator(s) being coupled by a narrow zone within which the overlapping of evanescent waves of the fields emitted by the first resonator and second resonator(s) can be established, thus creating mode coupling conditions, said first resonator being connected via a first port, to a first means allowing an interrogation (antenna, wire-based pathway) characterized in that said second resonator or resonators are connected via at least one second port, to at least one variable load element ($E_{CV}$) capable of modifying the coupling conditions of the resonant modes and consequently the response measured on said first port.

According to a variant of the invention, the transponder comprises at least one surface acoustic wave resonator-based structure.

According to a variant of the invention, the resonator-based structure comprises at least one first transducer positioned between a first reflector and a central reflector, a second transducer positioned between said central reflector and a second reflector, along a longitudinal axis, so as to create longitudinal coupled resonant acoustic modes whose propagation vector is perpendicular to said longitudinal axis.

The periods of the transducers and of the reflectors are chosen so that the waves under the reflecting arrays exhibit an evanescent character.

Advantageously, the periods of the reflectors are chosen so that the imaginary part of the corresponding normalized wave number coinciding with the frequency of synchronism of the transducers is a maximum.

According to a variant of the invention, the resonator-based structure is of symmetric type comprising at least one first central transducer and one second transducer split into two parts positioned on either side of the first transducer, said transducers being situated between reflectors.

According to a variant of the invention, the resonator-based structure is produced on the surface of a substrate of quartz type or of lithium niobate type or of lithium tantalate type.

According to a variant of the invention, the resonator-based structure comprises:
a first single-mode acoustic pathway comprising at least one first transducer positioned between two first reflectors,
a second single-mode acoustic pathway comprising at least one second transducer positioned between two second reflectors;
the first and second acoustic pathways being coupled so as to define transverse resonant acoustic modes propagating in a direction parallel to the acoustic pathways.

According to a variant of the invention, the resonator-based structure comprises:
- a first single-mode acoustic pathway comprising a first transducer positioned between a first reflector and a first central reflector, a second transducer positioned between said first central reflector and a second reflector;
- a second single-mode acoustic pathway comprising a third transducer positioned between a third reflector and a second central reflector, a fourth transducer positioned between said second central reflector and a fourth reflector;
- the first and second acoustic pathways being coupled so as to define transverse resonant acoustic modes propagating in a direction parallel to the acoustic pathways.

Such resonators may be synchronous, of so-called HicCup structure, asynchronous, etc. They are separated by a bus corresponding to a solid electrode under which the waves propagate at a greater phase speed than that under the array, creating the suitable conditions for coupling by evanescent waves. This type of coupling as well as longitudinal coupling is described notably in the article by William Steichen, Sylvain Ballandras, "Composants acoustique utilisés pour le filtrage: revue des différentes technologies" [Acoustic components used for filtering: review of the various technologies], Techniques de L'Ingénieur, E2000, TI Editions, 2008.

According to a variant of the invention, the first and second acoustic pathways are produced on a substrate of quartz type.

According to a variant of the invention, the first and second acoustic pathways are produced on a substrate of quartz type, possibly being of quartz cut type, compensated for temperature effects (family of AT cuts, etc.).

According to a variant of the invention, the first and second acoustic pathways are produced on a substrate of lithium tantalate type or of the type of a material for which the propagation of the waves under the array exhibits a lower phase speed than under the buses for an identical metal thickness.

According to a variant of the invention, the transponder comprises at least one bulk acoustic wave resonator-based structure.

According to a variant of the invention, the structure is of wafer type and comprises a piezoelectric material inserted between two first electrodes situated in one and the same plane, and a second electrode, the distance between said first electrodes and the second electrode being of the order of an acoustic half-wavelength $\lambda/2$ with $\lambda$: the acoustic wavelength such that the resonance corresponds to a vibration whose maximum energy is situated at the level of the neutral fiber of said wafer, satisfying the mechanical boundary conditions. The characteristic length of this vibration, i.e. the distance between two maxima of in-phase vibration amplitude in fact corresponds to twice the thickness of the wafer. The thickness of the wafer is therefore equal to a half-wavelength, so as to define a transverse coupling of evanescent bulk waves.

According to a variant of the invention, the structure comprises a piezoelectric material on the surface of a substrate, said structure furthermore comprising two first electrodes situated in one and the same plane and a second electrode buried in the piezoelectric material, the distance between said first electrodes and the surface of the substrate being of the order of an acoustic half-wavelength, so as to define a transverse coupling of evanescent bulk waves.

According to a variant of the invention, the structure comprises a piezoelectric material on the surface of a substrate and at least a first electrode in a first plane, a second electrode in a second plane and a third electrode in a third plane, the first resonator being defined between the first and the second electrodes, the second resonator being defined between the second and the third electrodes so as to define a longitudinal coupling of evanescent bulk waves, the structure comprising a stack of two structures of resonators comprising two wafers or films of piezoelectric material.

According to a variant of the invention, the piezoelectric material is of lithium niobate or lithium tantalate type.

Just as for the surface waves, it is possible to envisage multiplying the resonant elements and interconnecting them so as to produce varied structures intended notably to improve the sensitivity to the load.

According to a variant of the invention, the structure comprises a piezoelectric material flanked by two electrodes, the first electrode being loaded by a Bragg mirror (obtained as a stack of layers of acoustic impedances differing appreciably from a quarter wavelength in thickness), a second piezoelectric material flanked by two electrodes one of which is loaded acoustically by a Bragg mirror such as defined above, the two structures being linked via a stack also operating at the Bragg condition but of dimension allowing a coupling by evanescent waves of the waves trapped in the two resonators thus constructed.

The addition of a Bragg mirror in the upper surface makes it possible to envisage low-cost encapsulation options without requiring any air cavity, as is customarily the case for acousto-electronic devices.

In the present invention, the load element may be of capacitive type or of self-inductive type or of ohmic type.

According to a variant of the invention, the first means is an antenna.

According to a variant of the invention, the first means is wire-based.

Thus, the transponder of the present invention makes it possible to utilize the low ISM bands (434, 866, 915 MHz) with surface or bulk wave resonators, to circumvent temperature drifts by utilizing compensated modes, and to operate with components of very small sizes, such as bulk wave components of "HBARs" type described subsequently, doing so with an integrated reference.

The possibility of operating at 2.45 GHz by utilizing modes with a very large quality coefficient also represents an advantage of the present invention. In substance, the dimensions and the frequency versatility of the solution of the present invention render the latter particularly advantageous.

Additionally, the present invention offers more options than do delay lines, insofar as a large number of materials may be utilized according to the principle thereof (quartz, tantalate, niobate, bulk wave composites for HBARs such as niobate/quartz, AlN/Si, or materials specifically used in longitudinal coupling bulk wave resonators, such as AlN, ZnO).

Moreover, the present invention allows a differential frequency measurement, known to be immune to correlated parametric effects (the two modes of the structure are equally affected by thermal disturbances, vibrations, etc.).

Finally, the versatility of the present solution renders it genuinely competitive and versatile faced with the reduced options offered by delay lines and the measurement of a frequency is appreciably easier and more accurate than that of a flight time.

Indeed, for a well-defined flight time measurement, it is necessary that the transducers be as wideband as possible so that the corresponding temporal response be as short as possible.

The only ISM band allowing such an application is that centered at 2.45 GHz. It is necessary to measure delays of the order of a microsecond. This measurement may be carried out by counting which assumes a stable high-frequency clock, though it is also possible to analyze the evolution of the corresponding phase delay with the aid of suitable electronics.

This phase measurement involves an ambiguity related to the multiple trigonometric rotations for a given temperature range. Thus, a phase value is a many-one mapping in terms of temperature. The accuracy of the measurement depends essentially on the frequency source of the interrogation signals synthesizer which also provides the phase reference if necessary (the central emission frequency). For a measurement such as the latter, it is appropriate to emit in direct band at 2.45 GHz a pulse covering the maximum of the allowed band, i.e. 80 MHz—in practice 70 MHz so as not to emit outside of the tolerated limits—receive the signal initially amplified a first time, reduce it to baseband (demodulate it of its carrier at 2.45 GHz), and reamplify it before extracting therefrom the amplitude and the gain via a quadrature procedure.

It is then necessary to perform a Fourier transform (according to the approach described by L. Reindl, Wireless Passive SAW Identification Marks and Sensors, 2nd Int. Symp. Acoustic Wave Devices for Future Mobile Communication Systems, Chiba Univ. 3rd-5th March, 2004, which can serve as a basis of argumentation) so as to effectively evaluate the useful data. The accuracy of the measurement may be appreciably improved by averaging a large number—16 minimum—of measurements, and by combining flight time measurements and phase measurements.

BRIEF DESCRIPTION OF THE DRAWINGS

The invention will be better understood and other advantages will become apparent on reading the nonlimiting description which follows, in by virtue of the appended figures among which:

FIG. 15 illustrates the conductance as a function of frequency of a structure such as that illustrated in FIG. 14a;

DETAILED DESCRIPTION

In a known manner, the coupling of surface or bulk acoustic modes is widely used for the production of band filters in an extended radio-frequency domain (5 MHz-3 GHz). The principle consists in coupling two identical resonators by a narrow zone within which the overlapping of evanescent waves of the fields emitted by the two devices can be established, thus creating mode coupling conditions.

The applicant recalls that evanescent waves appear during a total reflection effect at an interface between two media and correspond to solutions of the propagation equations and boundary condition for which the energy density decreases in an exponential manner on moving away from the interface in the medium adjacent to that in which said reflection takes place. Such a reflection may be achieved in acoustics in solids at an interface between 2 media:

- of different acoustic impedance for certain angles of incidence;
- of propagation speed such that a guidance effect takes place between two regions of a waveguide, the medium of greater speed then being that in which the wave propagating (being excited) in the medium of lower speed exhibits the evanescent behavior;
- at least one of which is artificially modified by the presence of a periodic array, the wave incident at this medium propagating at the Bragg frequency, i.e. for a wave number equal to π divided by the wavelength and more generally in the spectral zone, termed the stop band, of the array:
- at least one of which is a periodic stack of materials of different acoustic impedance, thus forming a Bragg mirror.

The distance of penetration of the evanescent wave into the medium adjacent to that where the reflection takes place depends in fact on the wavelength, the acoustic properties of the medium where the evanescent wave is established, and the width of the stop band in the periodic media.

Thus the structure of the present invention makes it possible, via this coupling, to transmit information between the input and output points of the structure in a spectral zone conditioned by the level of coupling between the modes involved and the inherent electromechanical coupling of these modes.

More precisely, the present invention proposes to utilize this coupling property to translate a physical effect modifying the properties of an impedance load varying with the disturbing phenomenon. Indeed, passive surface or bulk elastic wave sensors may be interrogated remotely by well-established techniques. In the case of applications utilizing resonators in the ISM bands, the measurement of electrical quantity (capacitive loads, self-inductive loads, On-Off measurements) constitutes a range of problems that are difficult to solve with the customary devices if one wishes to carry out a reliable, accurate and repeatable measurement.

Accordingly, it is possible to resort to two dissociated resonators one of which serves only as reference, the second being wired up with the test body wherein variations in electrical properties give rise to variations in the resonance conditions.

In the present invention, one single component utilizing the abovementioned coupled modes allows differential measurement of the variations in the properties of the associated test body.

The invention thus makes it possible to produce components that are more compact, reliable and self-referenced, and optionally able to allow information coding.

Figure 1:
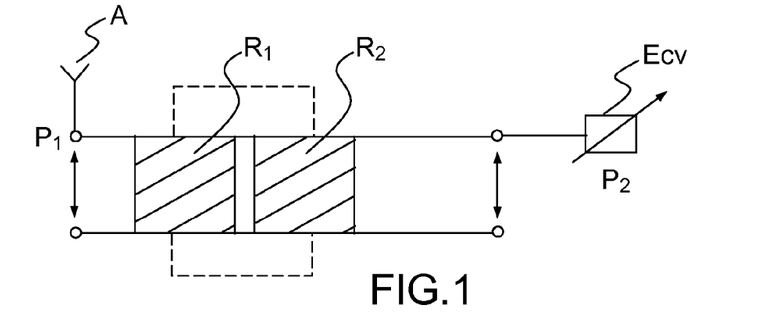
FIG. 1 shows diagrammatically a transponder according to the invention.

FIG. 1 shows diagrammatically a transponder according to the invention comprising two coupled resonators R1 and R2, linked respectively to a first port P1 and to a second port P2, the second port being linked to a variable load element Ecv, the first port being linked for example to an antenna A.

Exemplary Embodiment of a Transponder Comprising a Surface Acoustic Wave Coupled Resonator-Based Structure:

The example hereinafter illustrates the case of a structure of LCR type, corresponding to the acronym for "longitudinally coupled resonator filters", for defining a coupling of resonant modes with direction of propagation parallel to the electrodes, produced on quartz. It could just as well be a structure of LCR type on langasite, lithium tantalate, lithium niobate or thin films of AlN or ZnO deposited on silicon for example.

Figure 2:
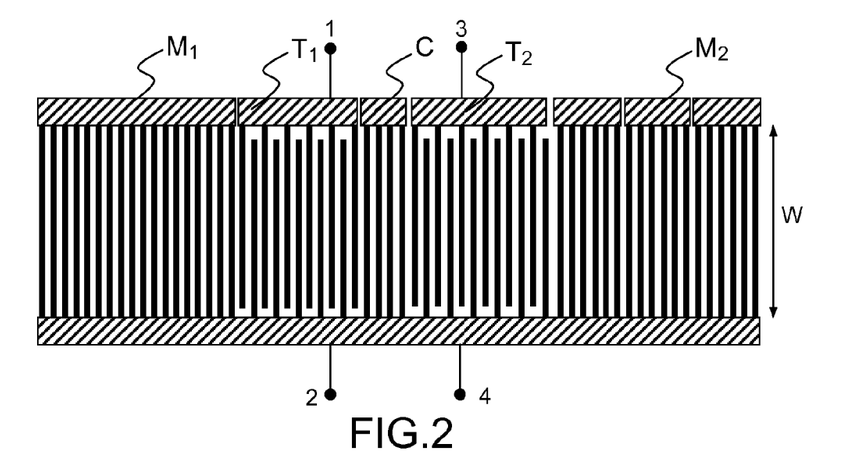
FIG. 2 illustrates a first exemplary structure used in a transponder according to the invention.

Transduction and mirror functions such as are illustrated in FIG. 2 are achieved with a first transducer T1 inserted between a first reflector M1 and a cavity C, and a second transducer T2 inserted between the cavity C and a second reflector M2, the acoustic aperture W being 140λ.

Generally, the value of the acoustic aperture conditions the value of static capacitance of the transducer and therefore makes it possible to define the targeted measurement range. It is thus possible to adjust the static capacitance of the transducer so as to render it sensitive to the range of variations desired, by taking account subsequently of the end behavior of the component in its measurement system.

The periods of the transducers and of the reflectors are chosen so that the waves under the reflecting arrays exhibit an evanescent character.

Advantageously, the periods of the reflectors are chosen so that the imaginary part of the corresponding normalized wave number coinciding with the frequency of synchronism of the transducers is a maximum.

In the case of the (YX/)/36° quartz cut (IEEE notation, Std-176, revision 1949), this synchronism frequency corresponds to entry of the stop band; i.e. a period of 3.56 μm for the transducers and a relative metallization thickness of around 3.5% (equivalent to an absolute thickness of 250 nm) and a metallization ratio of 0.7 (i.e. an electrode width of about 2.49 μm), thus giving rise to the excitation of a wave of characteristic length 7.12 μm (wavelength λ equal to twice the period).

It may be shown that ideally, the period of the reflectors is chosen as close as possible to 3.59 μm (±0.03 μm). This value must be adjusted as a function of the chosen operating points and of the width of the corresponding stop band. Such an adjustment requires the use of software for calculating the properties of the surface waves under an array of electrodes, such as presented in the article by S. Ballandras, A. Reinhardt, V. Laude, A. Soufyane, S. Camou, W. Daniau, T. Pastureaud, W. Steichen, R. Lardat, M. Solal, P. Ventura, "Simulations of surface acoustic wave devices built on stratified media using a mixed finite element/boundary integral formulation", J. Appl. Phys., 96, 7731-7741 (2004)], and in the article by S. Ballandras, R. Lardat, M. Wilm, Th. Pastureaud, A. Reinhardt, N. Champavert, W. Steichen, W. Daniau, V. Laude, R. Armati, G. Martin, "A mixed finite element/boundary element approach to simulate complex guided elastic wave periodic transducers", J. Appl. Phys. 105, 014911 (2009); doi: 10.1063/1.3021307].

In the case where resonance takes place at the exit of the stop band (case of certain quartz cuts for example), the period of the reflectors may thus turn out to be smaller than that of the transducers.

Figure 3:
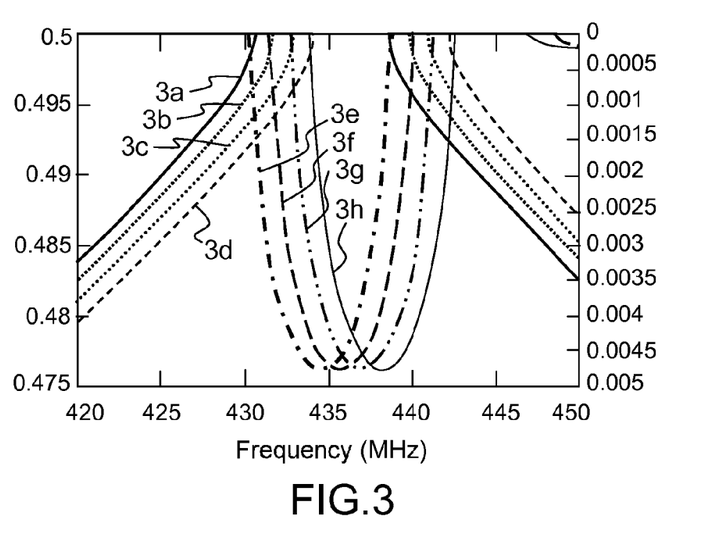
FIG. 3 illustrates the evolution of the stop band as a function of the period of the array, a calculation carried out by considering an infinite periodic array.

More precisely, FIG. 3 illustrates in this respect the evolution of the stop band as a function of the period of the array, a calculation carried out by considering an indefinite periodic array according to the approach presented in the article by S. Ballandras, A. Reinhardt, V. Laude, A. Soufyane, S. Camou, W. Daniau, T. Pastureaud, W. Steichen, R. Lardat, M. Solal, P. Ventura, "Simulations of surface acoustic wave devices built on stratified media using a mixed finite element/boundary integral formulation".

More precisely, the curves 3*a*, 3*b*, 3*c* and 3*d* relate respectively to the real parts Re for periods of 3.59 μm, 3.58 μm, 3.57 μm and 3.56 μm whereas the curves 3*e*, 3*f*, 3*g* and 3*h* relate to the imaginary parts Im for the periods of 3.59 μm, 3.58 μm, 3.57 μm and 3.56 μm.

It should be noted that the length of the array directly conditions the discrepancy between the frequencies of the modes of the structure: the larger this distance, the smaller the discrepancy between said frequencies. This distance is therefore optimized as a function of the targeted applications and especially of the constraints imposed by the frequency bands used.

Figure 4:
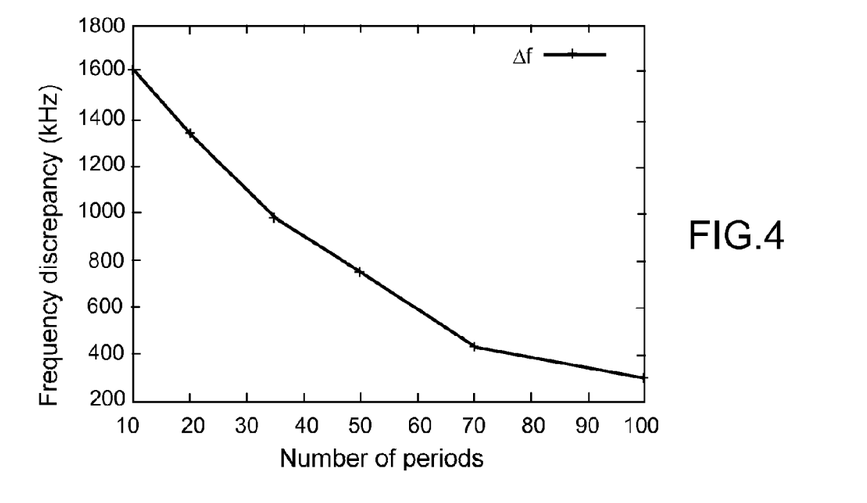
FIG. 4 illustrates the frequency discrepancy as a function of the number of periods.

For example, the ISM band centered at 434 MHz extends over a frequency domain of 1.7 MHz. In the previous configuration, by way of indication, it is possible to show how the frequency discrepancy between the two modes evolves as a function of the period number in the central reflector. It is seen that it is thus conceivable to design a component according to the invention with a frequency discrepancy that is controlled, over the whole of the ISM band.

FIG. 4 illustrates the evolution of the frequency discrepancy as a function of the number of periods.

More precisely, according to an exemplary embodiment, the structure comprises transducers of period equal to 3.56 μm for a metallization thickness of 250 nm (h/λ=3.5%), the reflectors exhibiting a period of 3.58 μm, this discrepancy in period being fundamental for the operation of the device.

The number of pairs of electrodes in the transducers T1 and T2 is 50 (100 fingers), 25 in the cavity C corresponding to the central reflector and 400 in the mirrors M1 and M2 corresponding to the first and the second reflectors, leading to a total device length of 3.67 mm for an aperture of 1 mm, by considering the propagation on an AT quartz cut, with a discrepancy between the two sought-after modes of nearly 500 kHz (hence the 25 electrodes in the cavity).

Figure 5:
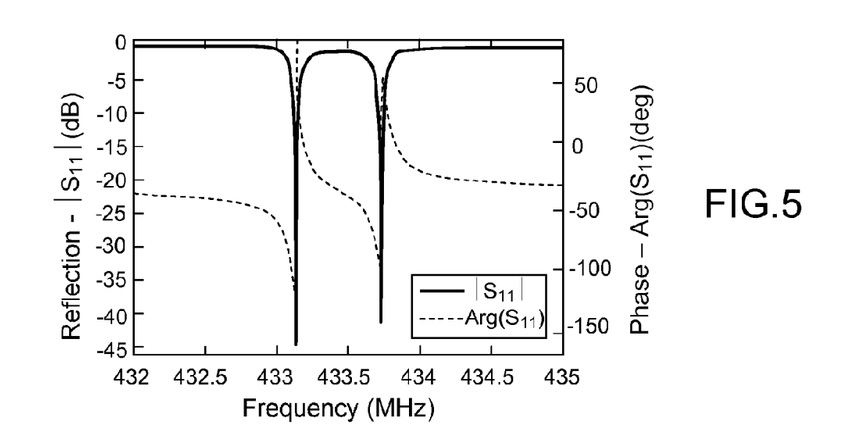
FIG. 5 illustrates the reflection parameter S11 of the structure represented in FIG. 2.

FIG. 5 shows the parameter S11 of one of the transducers highlighting the two modes contributing to the response of the four-pole device (1, 2, 3, 4).

Figure 6:
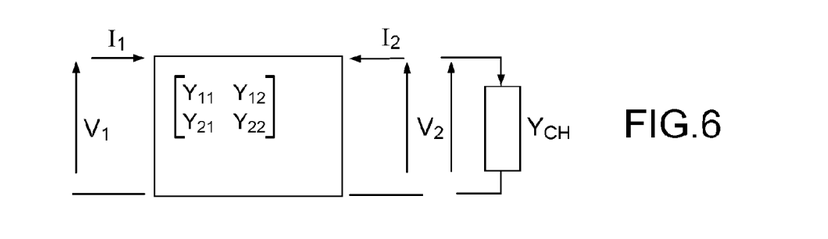
FIG. 6 illustrates the equivalent electrical schematic of the structure illustrated in FIG. 2.

The influence of a resistive load on one of the transducers of the resonator on the reflection response of the other transducer, assumed to be the interrogation point of the structure, has been evaluated. The equivalent electrical schematic for this structure is illustrated in FIG. 6.

In this case, the admittance of the input transducer is given by relation (1) where the parameters $Y_{ij}$ relate to the four-pole of the resonator, $Y_{Ch}$ represents the admittance of the resistive load and $Y'_{11}$ the equivalent admittance seen at the port 1.

$$Y'_{11} = Y_{11} - \frac{Y_{12}Y_{21}}{Y_{Ch} + Y_{22}} \quad (1)$$

It is noted that for particular cases, it is possible to show the impact of the resistive load in an obvious manner. In this instance:

if the load corresponds to an open circuit ($Y_{ch}=0$), we have $Y'_{11}=Y_{11}-Y_{12}Y_{21}/Y_{22}$;

if the load corresponds to a short-circuit case ($Y_{Ch}=\infty$) we have $Y'_{11}=Y_{11}$.

Between these two values, appreciable variations of $Y'_{11}$ are obtained as a function of the value of $Y_{ch}$.

Thus, the sensitivity may be adjusted by tuning the impedance of the resonator at resonance, by altering the aperture or the number of electrodes in the transducers (as commonly carried out to adjust the impedance at resonance of dipole resonators).

Figure 7:
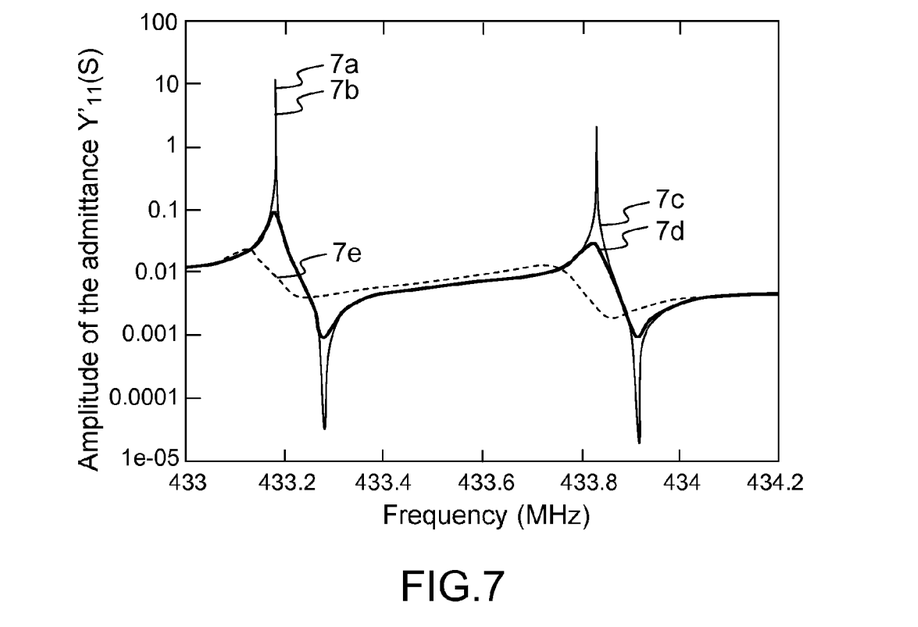
FIG. 7 illustrates the evolution of the amplitude of the admittance as a function of the resistive load applied to the structure illustrated in FIG. 2 for an acoustic aperture of 140λ.
Figure 8:
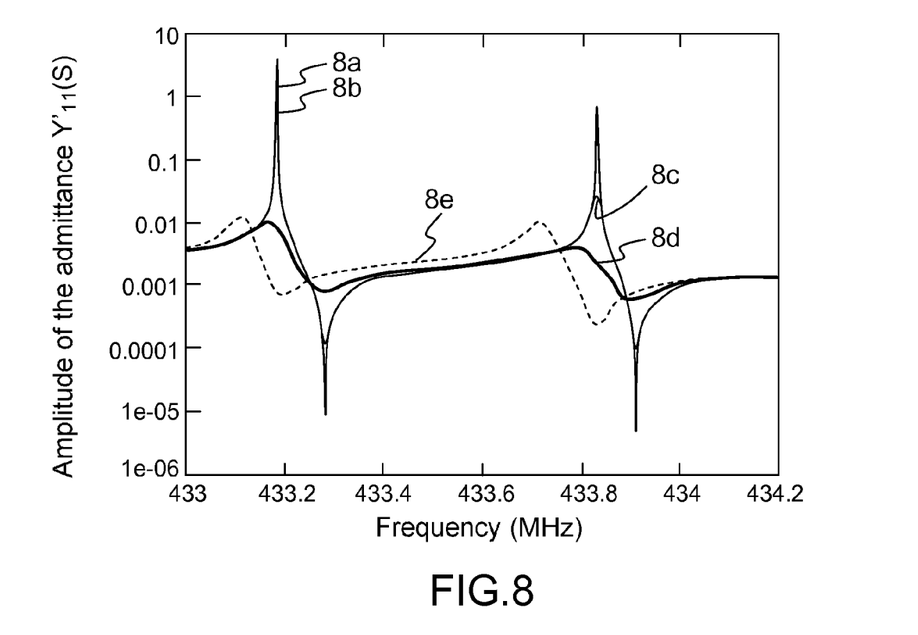
FIG. 8 illustrates the evolution of the amplitude of the admittance as a function of the resistive load applied to the structure illustrated in FIG. 2 for an acoustic aperture of 40λ.

FIGS. 7 and 8 show the evolution of the amplitude of the admittance as a function of the resistive load applied to the transducer T2, in the case of an acoustic coverage $W_1=140\lambda$ and in the case of an acoustic aperture $W_2=40\lambda$.

More precisely, curves 7a, 8a and 7b, 8b and 7c, 8c and 7d, 8d and 7e, 8e relate respectively to impedances of 1 MΩ, 100 kΩ, 10 kΩ, 1 kΩ and 100Ω.

Very sharply visible is the switch at impedance matching which causes the resonator to switch from one state to another in terms of resonant frequency, with a very large variation in the amplitude of the response corresponding to an energy absorption by the device.

It is apparent that the aperture has an appreciable impact on the impedance value for which this change of state occurs (in the vicinity of 100Ω for an aperture of 140λ as against 1 kΩ for an aperture of 40λ.

It may be observed moreover that the absolute amplitude of the peaks depends on the value of the load, but also the relative amplitude between the two peaks, except in the vicinity of matching where this ratio stabilizes, but where the peaks lose their spectral definition (tricky measurement).

It is also apparent that the relative spectral position of the peaks is modified by the load applied, so that it is possible to objectively determine the "short-circuit" and "open circuit" states while effectively performing a measurement and no longer through simple disappearance of the signal as was the case according to the known art, which in no case allowed the effective operation of the sensor to be determined.

Thus the discrepancy switches from 650 to 610 kHz whatever the acoustic aperture. This discrepancy is maximized by the coupling of the mode (discrepancy between free and metallized surface conditions as a first approximation), making it possible to envisage more significant frequency discrepancies by using more coupled materials (langasite, lithium tantalate, lithium niobate, etc.).

It is also beneficial to use a load element of capacitive type and it is possible to modify the absolute frequencies and the frequency discrepancy of the modes through a capacitive load suited to the value of capacitance, knowing that the relevant values are clearly bounded by the values of static capacitance and motional capacitance.

By referring to the equivalent Butterworth-Van Dyke schematic, well known to the person skilled in the art, a resonator based on piezoelectric material may be represented by a static capacitance to which is connected in parallel a so-called motional branch, which corresponds to the discrete components required to carry out the resonance function, i.e. a capacitance, a self-inductance and a resistance in series. These last three virtual components are consequently called motional elements, with reference to the vibration, for which they represent the electrical contribution conveyed by the piezoelectric effect.

Figure 9:
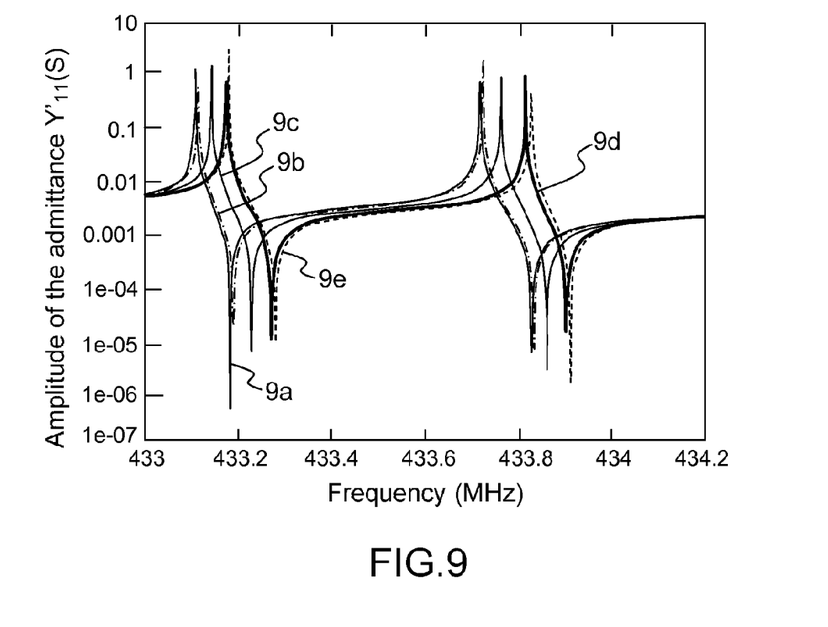
FIG. 9 illustrates the evolution of the amplitude of the admittance as a function of the capacitive load applied to the transducer T2 for an acoustic aperture of 40λ.

FIG. 9 shows the results obtained for an aperture of 40λ. It is seen that over a capacitance range of 10 pF to 10 fF (respectively curves 9a for an open circuit, 9b for 10 pF, 9c for 1 pF, 9d for 100 fF, 9e for 1 fF) the absolute and relative frequencies vary appreciably and allow direct or differential measurement. The structure is therefore very sensitive to reactive loads.

Figure 10:
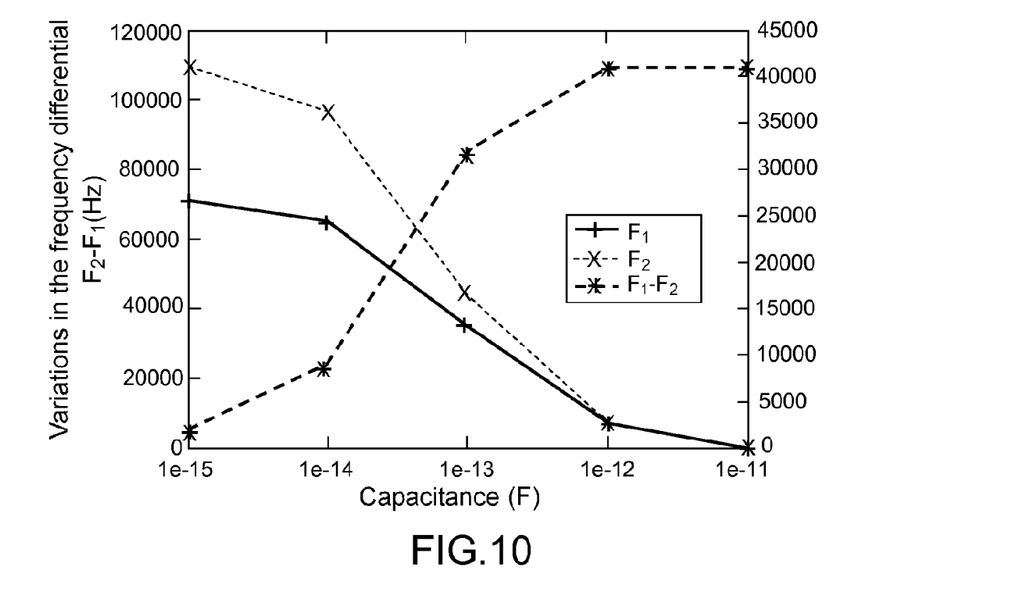
FIG. 10 illustrates the evolution of the differential of frequencies F2-F1, as a function of the value of the capacitive load applied in the structure illustrated in FIG. 2.

FIG. 10 shows the variations in the frequencies and in the differential. A sensitivity maximum is seen between 1 pf and 10 fF. This sensitivity domain is adjustable of course with the parameters of the resonator, in particular the acoustic aperture and the number of fingers of the transducers.

Figure 11:
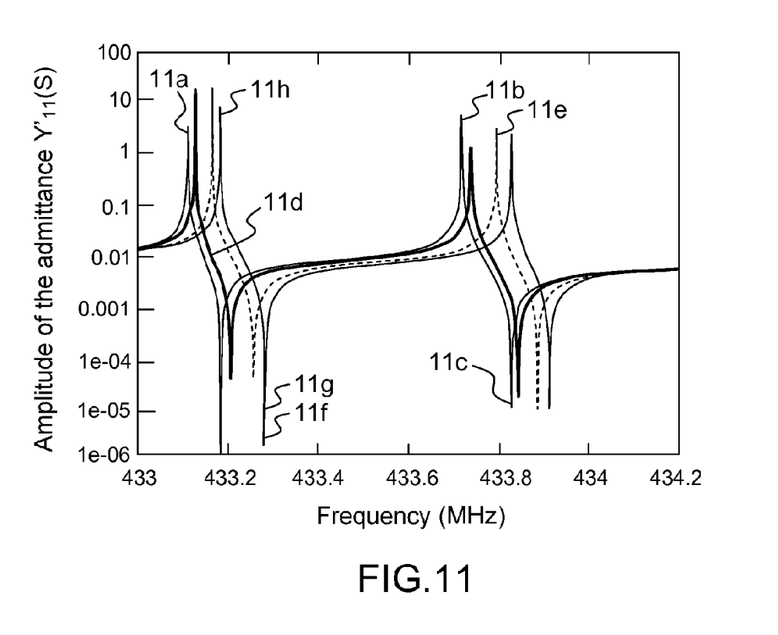
FIG. 11 illustrates the evolution of the amplitude of the admittance as a function of the capacitive load applied to the transducer T2 for an acoustic aperture of 140λ.

FIG. 11 shows the evolution of the spectrum as a function of the capacitive load for an aperture of 140λ.

More precisely, curve 11a relates to an infinite capacitance (open circuit), curve 11b to a capacitance of 1 nF, curve 11c to a capacitance of 100 pF, curve 11d to a capacitance of 10 pF, curve 11e to a capacitance of 1 pF, curve 11f to a capacitance of 100 fF, curve 11g to a capacitance of 10 fF and curve 11h to a capacitance of 1 fF.

It is apparent that by altering the aperture, the sensitivity point is effectively conditioned to the optimal capacitive load. The sensitivity of the sensor is in principle dictated by the electrical coupling of the modes which conditions the impact of the modification of the electrical conditions on the resonance properties of the device. The cut, the material and the nature of the mode may therefore be significant elements of component optimization.

Exemplary Embodiment of a Transponder Comprising a Transverse Bulk Acoustic Wave Coupled Resonator-Based Structure:

According to this variant of the invention, the transponder uses a bulk-wave-based structure produced with a layer of LiNbO3 (Y+36)/LiNbO3 (Y+36) cold compression bonded with thin films of gold. The niobate wafer affording the transduction function exhibits a thickness of 34 μm, i.e. a frequency of the fundamental mode of the transducer alone close to 110 MHz (for a speed of the longitudinal mode of the order of 7000 m.s$^{-1}$), with coupling optima for the so-called "HBAR" ("harmonic bulk acoustic resonant") modes for the odd harmonics of this same frequency (300, 500 and 700 MHz for harmonics 3, 5 and 7 respectively).

Figure 12:
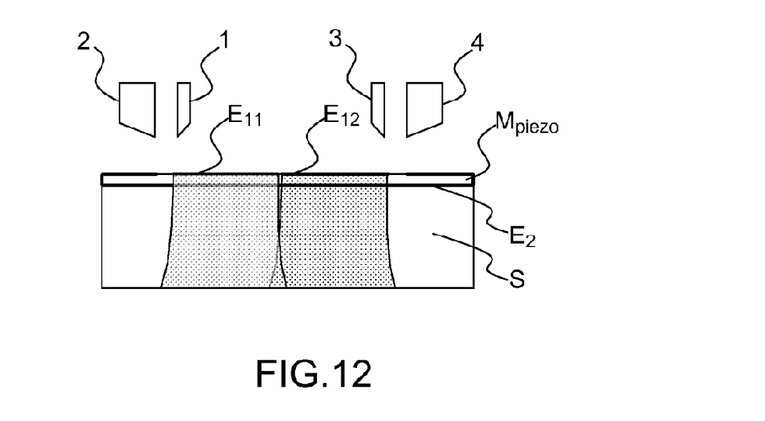
FIG. 12 illustrates a structural variant of coupled modes of bulk acoustic waves with transverse coupling, used in a transponder of the invention.

As illustrated in FIG. 12, a 300×200 μm$^2$ aluminum rectangular upper electrode is deposited on the surface of the wafer of piezoelectric material M$_{piezo}$. It is etched at its center so as to then give rise to two first upper electrodes E11 and E12 separated by an insulating band of 10 μm, of dimensions 145×200 μm$^2$.

An earth electrode E2 is provided with return of this electrode in the upper face of the substrate, making it possible to effectively produce the four-pole with the four ports 1, 2, 3, 4, as is illustrated in FIG. 10. Two coupled resonators are thus defined between respectively the electrodes E$_{11}$ and E$_2$ and E$_{12}$ and E$_2$.

With this type of structure, it is possible to place the resonances of the two modes in a narrow frequency band, such as for example the ISM bands centered at 434 or 866 MHz, and still more easily in the band centered at 2.45 GHz.

Figure 13A:
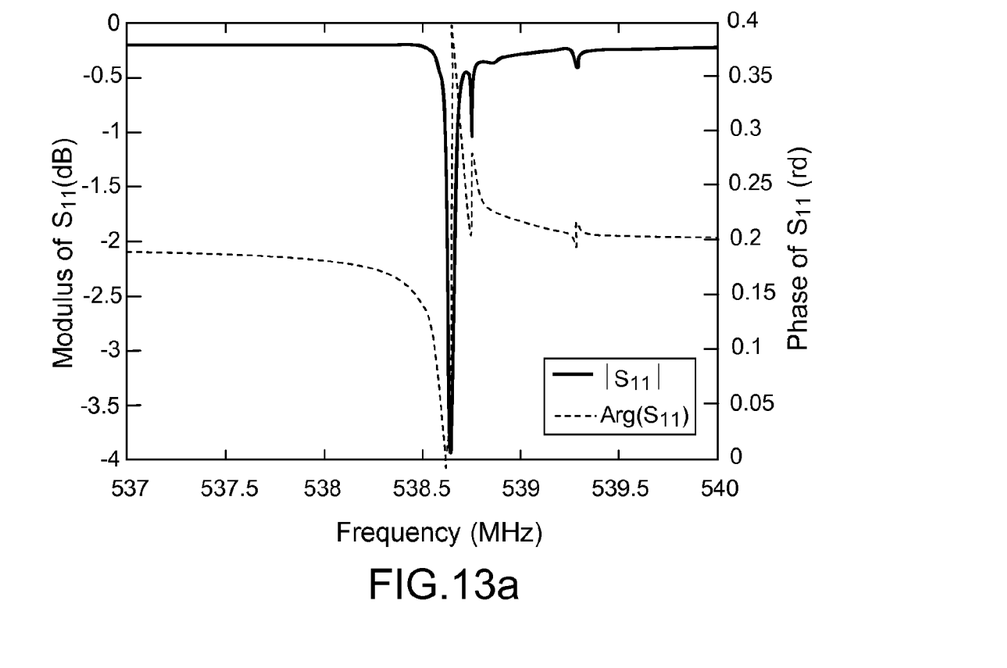
FIGS. 13a and 13b illustrate the admittance of one of the two resonators of the structure illustrated in FIG. 10 and coupled transversely as a function of the electrical conditions imposed on the associated resonator respectively in open circuit and in a circuit loaded by 50Ω.
Figure 13B:
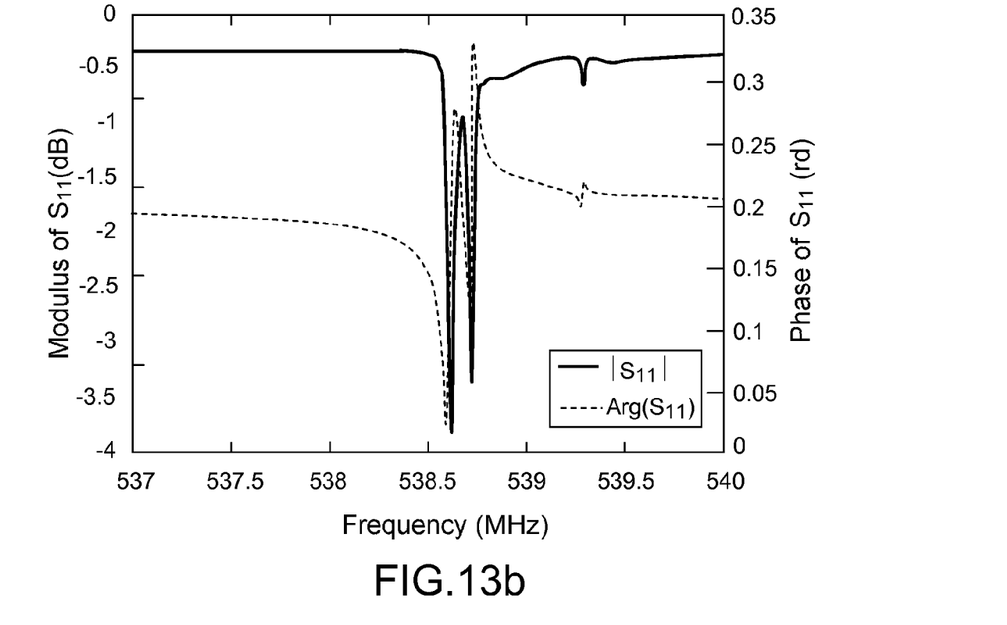

FIGS. 13a and 13b illustrate the admittance of one of the resonators as a function of the load conditions of its associated resonator: the first measurement is carried out in open circuit, that is to say the output of the four-pole is not electrically loaded, the second measurement corresponds to the case where the measurement of $S_{11}$ is performed while having imposed a load of 50Ω on the "output" resonator.

It is apparent that the second resonance of the admittance is strongly conditioned by the load of the resonator, thus suggesting that the energy is then transmitted well from a transducer to the other insofar as the system can actually tap energy from a load.

It is indeed this phenomenon which allows acousto-electrical regeneration at the level of the second transducer: the flow of the charge via a given impedance load, gives rise to favorable conditions of excitation of a wave in the second resonator which couples its energy with the mode of the input resonator.

It should be noted that despite the load applied to the second resonator, the two peaks always remain sharply resolved and allow easy a priori interrogation of the device, either by wire or in wireless mode.

It is apparent moreover that the absolute amplitude of the two peaks is affected by the load, and also the amplitude ratio between the two resonances, which could allow a finer analysis of the disturbing phenomenon. It is noted that the frequencies are on the other hand hardly affected by the load applied. For an inductive or capacitive load, a frequency pulling effect which modifies the spectral positions of the resonances may on the other hand be expected.

This phenomenon can also be utilized to trace back to the quantity disturbing the system.

Just as for an SAW device, these HBAR devices see the resonances coupled according to the approach proposed in the patent affected by a capacitive, resistive or self-inductive load. It is thus possible to perform the same type of measurement as those shown for the longitudinally coupled resonators, with sensitivities related to the coupling of the modes thus excited. If necessary, a simulation illustrating the phenomenon can be added, but it will in substance be curves of the same type as those produced for SAWs.)

Figure 14A:
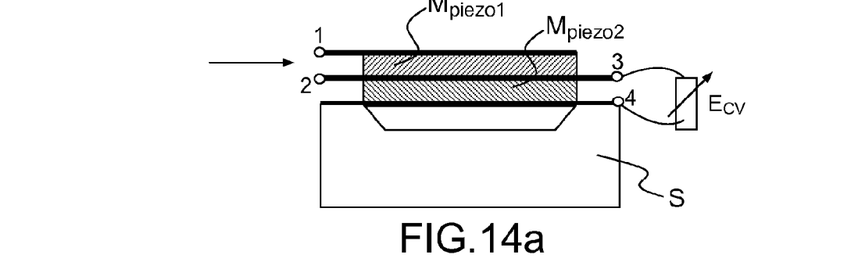
FIGS. 14a and 14b illustrate third structural variants of coupled modes of bulk acoustic waves with longitudinal coupling, used in a transponder of the invention.
Figure 14B:
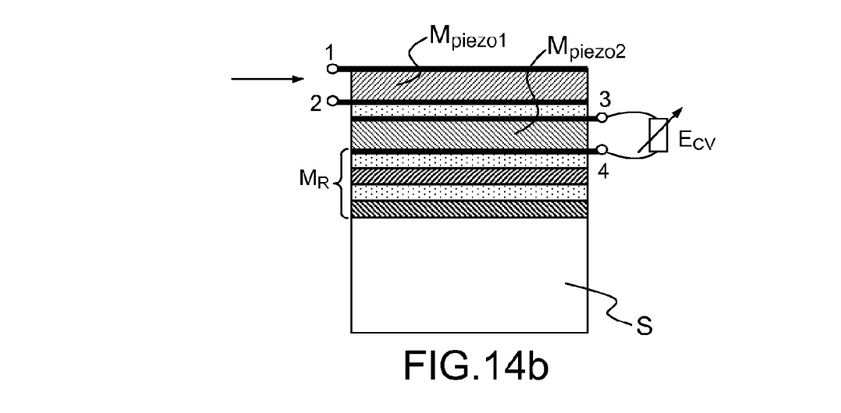

Exemplary Embodiment of a Transponder Comprising a Longitudinal Bulk Acoustic Wave Coupled Resonator-Based Structure:

According to this variant of the invention, the transponder of the invention uses the coupling of longitudinal modes obtained on the basis of a stack of two structures of resonators comprising two wafers or films of piezoelectric material $M_{piezo1}$ and $M_{piezo2}$ as illustrated in FIGS. 14a and 14b, respectively relating to a self-suspended structure on a substrate S with directly coupled resonators with no coupling layer and a structure with resonators with a coupling layer of Bragg mirror type $M_R$.

Typically, the substrate may be made of silicon. The layers of piezoelectric materials may be produced with the same piezoelectric material and consist of thin films of AlN of about 1 μm (corresponding to a thickness of λ/2).

Figure 15:
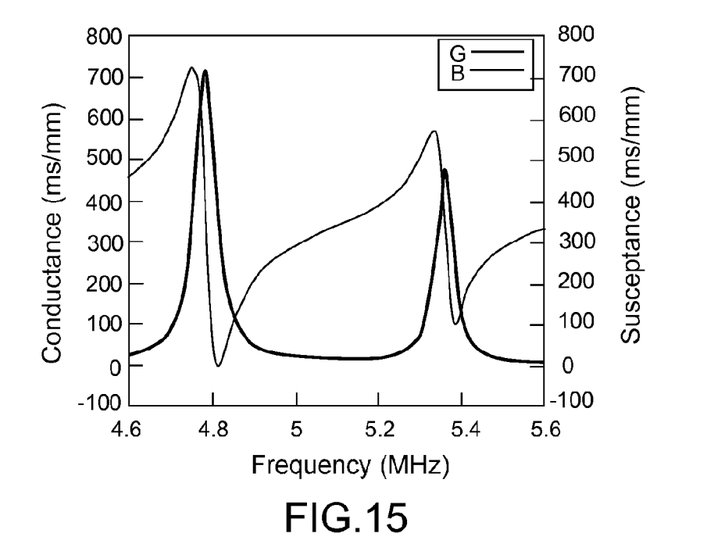

FIG. 15 illustrates the real and imaginary parts of the admittance (also called conductance and susceptance respectively) as a function of the frequency of the structure illustrated in FIG. 14a highlighting the existence of the two coupled modes.

According to the invention proposed here, one of the electrical ports of the structure may be connected to an electrical system (wire-based measurement) or to an antenna (wireless interrogation), the other port possibly being loaded with the aid of a capacitive, self-inductive or resistive load allowing as explained above an indirect measurement of physical quantities modifying said loads. The load applied to said electrical port may be complex (associate multiple reactive effects—self-inductive, resistive and capacitive) insofar as the evolution of the latter according to one or more physical quantities disturbing their operation is known.

Figure 16:
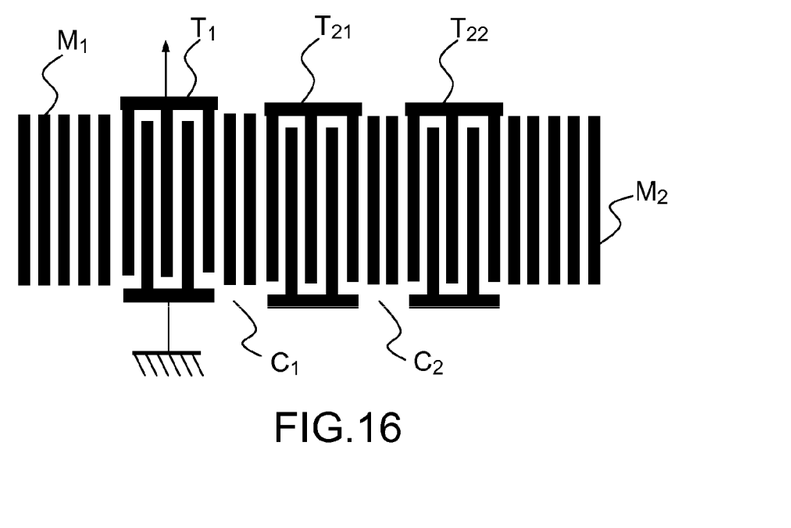
FIG. 16 illustrates a structure with three longitudinally coupled transducers.

According to a variant of the invention, the coupled devices described previously may be composed of more than two transducers, the first transducer still fulfilling its role of input point allowing the interrogation or the electrical measurement of the device in wire-based and wireless modes. The response of the device then reveals as many peaks as coupled transducers. This variant is illustrated in FIG. 16.

The device considered is composed here of three transducers $T_1$, $T_{21}$ and $T_{22}$ placed in one and the same direction of propagation of the waves, and separated from one another by a reflecting array comprising thirty electrodes connected to the electrical reference. In the example proposed here, the spacing of the transducers is 3.37 μm, that of the reflectors is 3.55 μm, the metallization ratio being fixed at 0.7. The electrode thickness is 450 nm, corresponding to a relative thickness (thickness of metal divided by the acoustic wavelength equal to twice the spacing of the array) in the transducers and the reflectors of 6.34 and 6.68% respectively. The device is surrounded on either side by reflecting arrays $M_1$ and $M_2$, a cavity $C_1$ and $C_2$ separating respectively the transducers $T_1$ and $T_{21}$ and $T_{21}$ and $T_{22}$.

Figure 17:
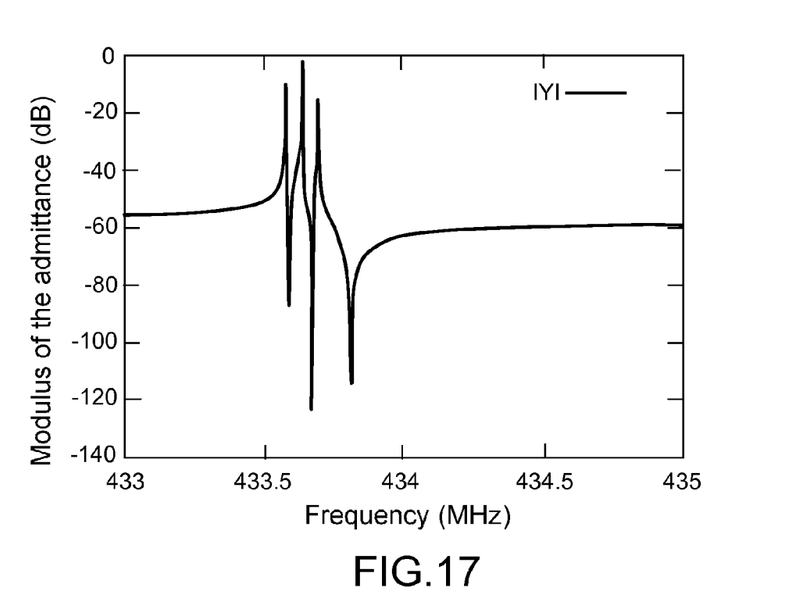
FIG. 17 illustrates the admittance response of the first transducer of a structure with three transducers.
Figure 18:
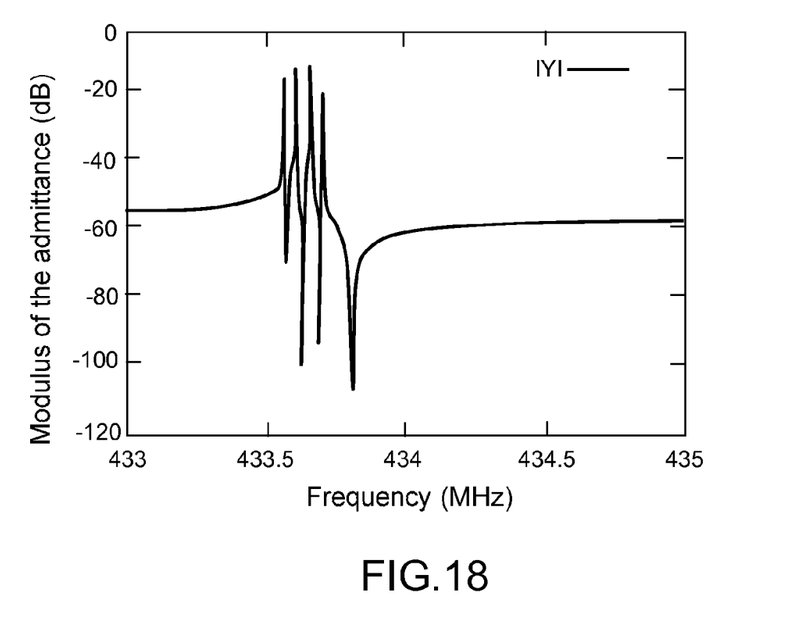
FIG. 18 illustrates the admittance response of the first transducer of a structure with four transducers.

The admittance response of the first transducer of a structure with 3 transducers is shown in FIG. 17, and the admittance response of the first transducer of a structure with 4 transducers is shown in FIG. 18.

It is shown that it is thus conceivable to produce a binary code resolved in the frequency space. It is possible to modulate this response by altering the load applied to each transducer so as to modify said response, it is also possible by design to position the resonances so as to produce the binary code mentioned above.

The invention claimed is:

1. A transponder, comprising:
   at least one first resonator and one or more second resonators coupled by evanescent waves exhibiting a first resonant mode and a second resonant mode, wherein said first resonator and said second resonators are coupled by a narrow zone within which overlapping of evanescent waves of fields emitted by the first resonator and the second resonators create mode coupling conditions;
   a first port connected to said first resonator;
   first means connected to the first port allowing an interrogation;
   at least one second port connected only to said second resonators; and
   at least one variable load element connected only to the at least one second port, the at least one variable load element configured to modify coupling conditions of the resonant modes and consequently a response measured on said first port.

2. The transponder according to claim 1, wherein the transponder has at least one surface acoustic wave resonator-based structure.

3. The transponder according to claim 2, wherein the surface acoustic wave resonator-based structure comprises:
   at least one first transducer positioned between a first reflector and a central reflector; and
   a second transducer positioned between said central reflector and a mirror reflector, along a longitudinal axis, to create longitudinal coupled resonant acoustic modes whose propagation vector is collinear with said longitudinal axis.

4. The transponder according to claim 3, wherein the surface acoustic wave resonator-based structure is of symmetric type comprising at least one first central transducer and one second transducer split into two parts positioned on either side of the first transducer, wherein said transducers are situated between reflectors.

5. The transponder according to claim 3, wherein the surface acoustic wave resonator-based structure is produced on the surface of a substrate of quartz type, of lithium niobate type, of lithium tantalate type, of langasite, or of a composite substrate based on piezoelectric thin film made of AlN or of ZnO on silicon.

6. The transponder according to claim 2, wherein the surface acoustic wave resonator-based structure comprises:
  a first single-mode acoustic pathway comprising at least one first transducer positioned between two first reflectors; and
  a second single-mode acoustic pathway comprising at least one second transducer positioned between two second reflectors,
  wherein the first and second acoustic pathways are coupled so as to define transverse resonant acoustic modes propagating in a direction parallel to the acoustic pathways.

7. The transponder according to claim 6, wherein the surface acoustic wave resonator-based structure comprises:
  a first single-mode acoustic pathway comprising a first transducer positioned between a first reflector and a first central reflector, and a second transducer positioned between said first central reflector and a second reflector; and
  a second single-mode acoustic pathway comprising a third transducer positioned between a third reflector and a second central reflector, and a fourth transducer positioned between said second central reflector and a fourth reflector,
  wherein the first and second acoustic pathways are coupled so as to define transverse resonant acoustic modes propagating in a direction parallel to the acoustic pathways.

8. The transponder according to claim 6, wherein the first and second acoustic pathways are produced on a substrate of quartz type compensated for temperature effects.

9. The transponder according to claim 1, further comprising at least one bulk acoustic wave resonator-based structure.

10. The transponder according to claim 9, wherein the resonator-based structure comprises
  a piezoelectric material inserted between two first electrodes situated in one and the same plane, and
  a second electrode, wherein
  a distance between said first electrodes and the second electrode is of the order of an acoustic half-wavelength, the acoustic wavelength being equal to the ratio of the speed of the mode over its resonant frequency, so as to define a transverse coupling of evanescent bulk waves.

11. The transponder according to claim 9, wherein the resonator-based structure comprises
  a piezoelectric material on the surface of a substrate;
  two first electrodes situated in one and the same plane; and
  a second electrode buried in the piezoelectric material, wherein
  a distance between said first electrodes and the surface of the substrate being of the order of an acoustic half-wavelength, so as to define a transverse coupling of evanescent bulk waves.

12. The transponder according to claim 9, wherein the resonator-based structure comprises
  a piezoelectric material on the surface of a substrate;
  at least a first electrode in a first plane;
  a second electrode in a second plane; and
  a third electrode in a third plane, wherein
  the first resonator is defined between the first and the second electrodes,
  the second resonator is defined between the second and the third electrodes so as to define a longitudinal coupling of evanescent bulk waves, and
  the resonator-based structure comprises a stack of two structures of resonators comprising two wafers or films of piezoelectric material.

13. The transponder according to claim 10, wherein the piezoelectric material is of lithium niobate or lithium tantalate type.

14. The transponder according to claim 1, wherein the load element is of capacitive type.

15. The transponder according to claim 1, wherein the load element is of self-inductive type.

16. The transponder according to claim 1, wherein the load element is of ohmic type.

17. The transponder according to claim 1, wherein the first means is an antenna.

18. The transponder according to claim 1, wherein the first means is wire-based.

19. The transponder according to claim 1, wherein an admittance of the at least one first resonator is a function of the at least one variable load element.

20. The transponder according to claim 3, wherein a static capacitance of the at least one surface acoustic wave resonator-based structure is a function of an acoustic aperture of the at least one first transducer or the second transducer.

* * * * *